(12) United States Patent
Lancaster et al.

(10) Patent No.: US 11,740,267 B2
(45) Date of Patent: Aug. 29, 2023

(54) LOAD-SIDE VOLTAGE SENSING IN A POWER METER

(71) Applicant: Itron, Inc., Liberty Lake, WA (US)

(72) Inventors: Andrew Lancaster, Fair Play, SC (US); Stephen Ross Sanner, Seneca, SC (US)

(73) Assignee: Itron, Inc., Liberty Lake, WA (US)

( * ) Notice: Subject to any disclaimer, the term of this patent is extended or adjusted under 35 U.S.C. 154(b) by 247 days.

(21) Appl. No.: 17/180,206

(22) Filed: Feb. 19, 2021

(65) Prior Publication Data

US 2022/0065905 A1    Mar. 3, 2022

Related U.S. Application Data

(60) Provisional application No. 63/072,005, filed on Aug. 28, 2020.

(51) Int. Cl.
| | | |
|---|---|---|
| *G01D 4/00* | (2006.01) | |
| *G01R 35/04* | (2006.01) | |
| *G01R 22/06* | (2006.01) | |
| *G01R 19/155* | (2006.01) | |
| *H02J 3/06* | (2006.01) | |

(52) U.S. Cl.
CPC .......... *G01R 22/063* (2013.01); *G01D 4/004* (2013.01); *G01R 35/04* (2013.01); *H02J 3/06* (2013.01)

(58) Field of Classification Search
None
See application file for complete search history.

(56) References Cited

U.S. PATENT DOCUMENTS

| | | | |
|---|---|---|---|
| 2003/0133315 A1 | 7/2003 | Lucas | |
| 2008/0088297 A1* | 4/2008 | Makinson | G01D 4/004 324/110 |
| 2008/0204953 A1* | 8/2008 | Shuey | G01R 11/25 361/60 |
| 2011/0115399 A1 | 5/2011 | Sadwick et al. | |
| 2015/0247900 A1 | 9/2015 | Shuey et al. | |
| 2016/0187393 A1* | 6/2016 | Ramirez | G01R 19/155 324/126 |
| 2017/0372765 A1 | 12/2017 | Kawamura | |
| 2019/0033352 A1* | 1/2019 | Boudreau, Jr. | G01R 22/061 |

FOREIGN PATENT DOCUMENTS

EP    1413055 A2    4/2004

OTHER PUBLICATIONS

The International Search Report and Written Opinion for PCT Application No. PCT/US21/36431, dated Oct. 6, 2021, 174 pages.

\* cited by examiner

*Primary Examiner* — Curtis A Kuntz
*Assistant Examiner* — Jerold B Murphy
(74) *Attorney, Agent, or Firm* — Lee & Hayes, P.C.

(57) ABSTRACT

A load-side voltage detection module for a metrology device includes a plurality of first resistors electrically coupled to a first load-side terminal, the first resistors being in series, a plurality of second resistors electrically coupled to a second load-side terminal, the second resistors being in series, a voltage divider electrically coupled between a first line-side terminal and a second line-side terminal, the voltage divider creating a reference voltage for the load-side voltage detection module, and a pulse generator to generate a pulse based on detection of voltage, the pulse indicating a voltage on at least one of the first load-side terminal or the second load-side terminal, above at least one threshold.

19 Claims, 6 Drawing Sheets

LOAD-SIDE VOLTAGE SENSING IN A POWER METER

PRIORITY

This application claims priority to U.S. provisional patent application No. 63/072,005, filed Aug. 28, 2020, which is incorporated herein by reference.

TECHNICAL FIELD

The present disclosure relates generally to utility meters. Specifically, the present disclosure relates to systems and methods of sensing load-side voltages within a metrology device such as an electrical power meter.

BACKGROUND

Utility metering units or devices such as electric, water, and gas meters are devices that measure the amount of the utility such as electricity, water, and gas consumed by a residence, a commercial property, or an electrically powered device. As consumers of the utility consume the utility, the consumer is expected to compensate the entity providing the utility (e.g., utility company). Oftentimes, the consumer is either unable or unwilling to provide such compensation, and the utility company may restrict the consumer's access to the utility by physically disconnecting the utility from the consumer's building or engaging a disconnect device that restricts consumption of the utility.

For example, electrical power measured by a utility metering unit such as an electrical power meter, may be remotely disconnected by an administrator operating at a central office located remote with respect to the consumer's building. This remote disconnection of the electrical power may be performed by remotely instructing the electrical power meter to stop providing the electrical power via a power line communication (PLC) system with a disconnect signal being communicatively propagated through a network of electrical power meters communicated using a PLC communications technology. The disconnect signal may cause a disconnect switch to open causing electricity to cease to flow through the electrical power meter into the consumer's building.

In instances where electrical power is disconnected from the consumer's building, the consumer may attempt to obtain electrical power from an alternative electrical power source including, for example, from a generator connected to the consumer's building, an alternative power source such as a photovoltaic cell array, by running electrical cable from a neighboring building and utilizing the electrical power supplied to the neighboring building, or by some other means of obtaining electrical power apart from the electrical power utility provider. The consumer may also attempt to bypass the electrical power meter altogether. In these instances, and before the utility is restored to the consumer's building, a voltage is created on the load-side of the electrical power meter via the alternative electrical power source.

In instances where the consumer properly compensates the utility company for the consumed utility (e.g., electrical power), the consumed utility may be restored to the consumer's building once again for consumption. In past utility restoration processes, a technician may physically visit the consumer's building and restore access to the utility. During the visit by the technician, the technician may be able to determine whether the alternative source of electrical power is still connected to the consumer's building, and may disconnect the alternative source of electrical power to avoid damage to the electrical power meter, the devices and/or circuits associated with the alternative source of electrical power, the consumer's building, and other property.

However, because the utility company can restore the electrical power to the consumer's building remotely via an administrator operating at the central office and the PLC system, the utility company may not be aware of the alternative electrical power source coupled to the load-side of the electrical power meter without a physical inspection by the technician. Reconnecting the electrical power to the consumer's building via instruction to the electrical power meter via the PLC system may cause a number of issues. For example, a technician that may be otherwise dispatched to reconnect the electrical power, is not dispatched because the reconnection is performed remotely. Thus, no inspection of the consumer's building is made including a determination as to whether the alternative electrical power source is coupled to the load-side of the electrical power meter and/or whether a voltage is present on the load-side of the electrical power meter which indicates that the alternative electrical power source is present.

Not performing such an inspection to detect load-side voltages may result in serious damage to, for example, devices and/or circuit elements electrically coupled to the load-side of the electrical power meter should the disconnect switch of the electrical power meter be closed. For example, damage to a generator or other power circuit(s) included within, for example, the neighboring building that are coupled to the load-side of the electrical power meter may occur including shorting out of the power circuit(s). Further, reconnection of the electrical power to the electrical power meter without performing load-side detection in the presence of a load-side voltage may result in damage to the electrical power meter including catastrophic damage to electrical components therein. Still further, such oversight in load-side detection in the presence of a load-side voltage may result in other types of serious electricity-related incidents and accidents including electricity-related fires.

BRIEF DESCRIPTION OF THE DRAWINGS

The detailed description is set forth below with reference to the accompanying figures. In the figures, the left-most digit(s) of a reference number identifies the figure in which the reference number first appears. The use of the same reference numbers in different figures indicates similar or identical items. The systems depicted in the accompanying figures are not to scale and components within the figures may be depicted not to scale with each other.

DESCRIPTION OF EXAMPLE EMBODIMENTS

Figure 1:
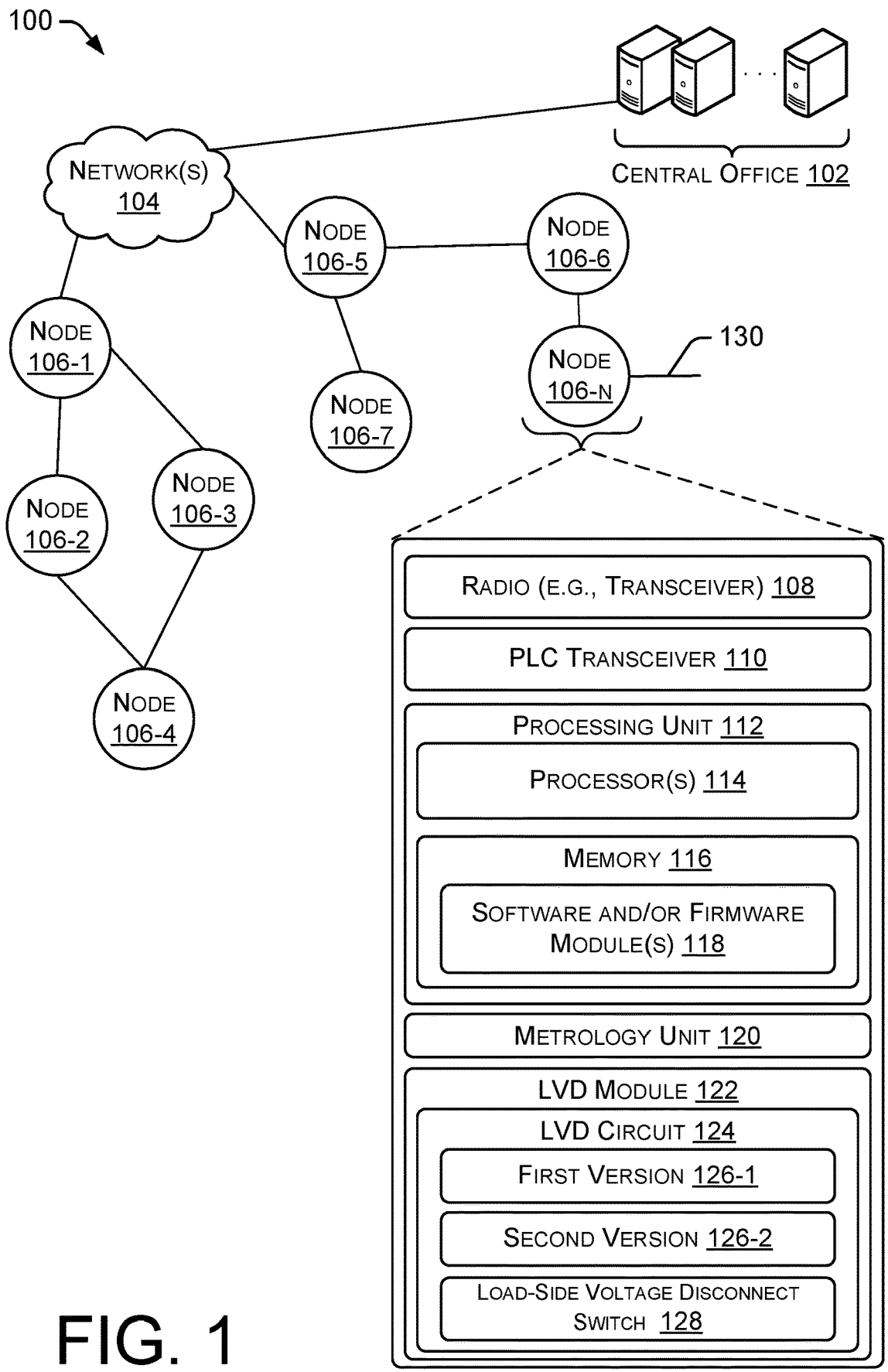
FIG. 1 is a diagram showing a high-level view of a network including nodes configured with a load-side voltage detection module, according to an example of the principles described herein.

As mentioned above, a utility metering unit (also referred to herein as a "utility meter" or a "metrology device") may be instructed by a remote central office to remotely open and close a disconnect switch of the utility metering unit (e.g., electrical power meter) to disconnect and connect/reconnect the utility service (e.g., electrical power) provided via the utility metering unit. However, the presence of a load-side voltage at the utility metering unit may protect the utility metering unit, devices and/or circuits associated with an alternative source of electrical power coupled to the load-side of the utility metering unit, the consumer's building, and other property from being damaged.

In some areas of the world, government or industry testing requirements may include functionality for detecting load-side voltage with a solid-state meter in order to avoid the potential of damage in instances where the alternative source of electrical power is coupled to the load-side of the utility metering unit as described herein. For example, the National Electrical Manufacturers Association (NEMA) has released standard C12.30 in 2019 entitled, "Test Requirements for Metering Devices Equipped with Service Switches" (hereinafter "NEMA C12.30") which is incorporated by reference herein in its entirety. NEMA C12.30 includes requirements that previously established methods may not meet. For example, NEMA C12.30 includes requirements for an electric meter to be able to detect the presence of a back-feed voltage on the load-side terminals and prevent closure of the disconnect switch in the event that back feed voltage above a certain level or threshold is detected. These requirements specify back feed voltage thresholds that are to be used to determine when to close or refrain from closing the disconnect switch of the utility metering unit. These thresholds may be different depending on whether the voltage detected on the load-side terminals of the meter are in-phase or out-of-phase with each other.

OVERVIEW

In the examples described herein, a load-side voltage detection module for a metrology device may be used to identify instances where the disconnect switch of the metrology device may be closed safely without risk of the damage to the utility metering unit, devices and/or circuits associated with an alternative source of electrical power coupled to the load-side of the utility metering unit, the consumer's building, and other property described herein. Further, the examples described herein provide systems and methods to remotely disconnect and connect/reconnect the utility service (e.g., electrical power) provided via the utility metering unit without the need to dispatch a technician to the utility metering unit while maintaining the safety measures afforded by the load-side detection module.

Examples described herein provide a load-side voltage detection module for a metrology device. The load-side voltage detection module may include a plurality of first resistors electrically coupled to a first load-side terminal, the first resistors being in series, and a plurality of second resistors electrically coupled to a second load-side terminal, the second resistors being in series. The load-side voltage detection module may also include a voltage divider electrically coupled between a first line-side terminal and a second line-side terminal, the voltage divider creating a reference voltage (e.g., a virtual ground voltage) for the load-side voltage detection module. The load-side voltage detection module may also include a pulse generator to generate a pulse based on detection of voltage, the pulse indicating a voltage on the first load-side terminal and/or the second load-side terminal above at least one threshold.

The first load-side terminal and the second load-side terminal are in phase or out of phase with respect to one another. The first resistors and the second resistors have different resistance values. In one example, the pulse generator may include a first diode, a second diode in series with the first diode, a capacitor in parallel with the first diode, a first transistor, a second transistor in series with the first transistor, the first transistor and the second transistor being in parallel with the capacitor, and an optoisolator electrically coupled to the second transistor, the optoisolator generating the pulse on an isolated output. The pulse may be output to an application specific integrated circuit (ASIC) of the metrology device. The voltage divider creates a virtual ground.

In one example, the pulse generator may include a first transistor electrically coupled to the first resistors, and a second transistor electrically coupled to the second resistors, the first transistor and the second transistor generating the pulse on an isolated output.

Examples described herein also provide a metrology device including a load-side voltage detection module. The load-side voltage detection module includes a plurality of first resistors electrically coupled to a first load-side terminal, the first resistors being in series, a plurality of second resistors electrically coupled to a second load-side terminal, the second resistors being in series, a voltage divider electrically coupled between a first line-side terminal and a second line-side terminal, the voltage divider creating a reference voltage for the load-side voltage detection module, and a pulse generator to generate a pulse based on detection of voltage, the pulse indicating a voltage on at least one of the first load-side terminal or the second load-side terminal above at least one threshold.

The pulse generator includes a first diode, a second diode in series with the first diode, a capacitor in parallel with the first diode, a first transistor, a second transistor in series with the first transistor, the first transistor and the second transistor being in parallel with the capacitor, and an optoisolator electrically coupled to the second transistor, the optoisolator generating the pulse on an isolated output. The pulse generator includes a first transistor electrically coupled to the first resistors, and a second transistor electrically coupled to the second resistors, the first transistor and the second transistor generating the pulse on an isolated output.

The first load-side terminal voltage and the second load-side terminal voltage may be out of phase with respect to one another. The first resistors and the second resistors have different resistance values. The pulse may output to an application specific integrated circuit (ASIC) of the metrology device. The voltage divider may be used to create a reference voltage (e.g., a virtual ground voltage). The metrology device may further include a load-side voltage disconnect switch electrically coupled to the load-side voltage detection module.

Examples described herein also provide a network that includes a metrology device communicatively coupled within the network, and a central office communicatively coupled to the metrology device at least in part over a power line. The metrology device includes a metrology unit. The metrology unit includes a load-side voltage detection circuit. The load-side voltage detection module includes a plurality of first resistors electrically coupled to a first load-side terminal, the first resistors being in series, a plurality of second resistors electrically coupled to a second load-side terminal, the second resistors being in series, a voltage divider electrically coupled between a first line-side terminal and a second line-side terminal, the voltage divider creating a reference voltage (e.g., a virtual ground voltage) for the load-side voltage detection module, and a pulse generator to generate a pulse based on detection of voltage, the pulse indicating a voltage on at least one of the first load-side terminal or the second load-side terminal above at least one threshold.

The pulse generator may include a first diode, a second diode in series with the first diode, a capacitor in parallel with the first diode, a first transistor, a second transistor in series with the first transistor, the first transistor and the second transistor being in parallel with the capacitor, and an optoisolator electrically coupled to the second transistor, the optoisolator generating the pulse on an isolated output.

The pulse generator may include a first transistor electrically coupled to the first resistors, and a second transistor electrically coupled to the second resistors, the first transistor and the second transistor generating the pulse on an isolated output.

The first resistors and the second resistors may have different resistance values, and the voltage divider may be a virtual voltage divider. The network may further include a load-side voltage disconnect switch electrically coupled to the load-side voltage detection module.

Additionally, the techniques described in this disclosure may be performed as a method and/or by a system having non-transitory computer-readable media storing computer-executable instructions that, when executed by one or more processors, performs the techniques described above.

EXAMPLE EMBODIMENTS

Turning now to the figures, FIG. 1 is a diagram showing a high-level view of a network architecture 100 including nodes 106 configured with a load-side voltage detection module. FIG. 1 also includes a component diagram of example components of a node 106 that includes a load-side voltage detection (LVD) module 122. The network architecture 100 includes a plurality of node(s) 106-1, 106-2, 106-3, 106-4, 106-5, 106-6, 106-7, . . . , 106-N, where N is any integer greater than or equal to 1 (collectively referred to herein as node(s) 106 unless specifically addressed otherwise). The nodes 106 are communicatively coupled to each other via direct communication paths or "links." In this example, N represents a number of nodes in an autonomous routing area (ARA), such as a wide area network (WAN), metropolitan area network (MAN), local area network (LAN), neighborhood area network (NAN), field area network (FAN), personal area network (PAN), among other types of networks. As an example, nodes 106 may be configured in a radio frequency (RF) mesh, a power line communication (PLC) mesh, or both. In one example, nodes 106 may be part of a low power and lossy network (LLN).

As used in the present specification and in the appended claims, the term "link" is meant to be understood broadly as any direct communication path between two nodes (e.g., a "one hop" transmission that does not pass through or become propagated by another node). Each link may represent a plurality of channels or one or more variable data rate channels over which a node 106 is able to transmit or receive data. Each link may include multiple communication technologies, such as, for example, one or more RF communication technologies, one or more PLC communication technologies, or both (among other communication technologies). Thus, the communication technologies may utilize RF signals and/or PLC signals (among other types of signals) in communicating with one another and with other devices, systems, and networks such as, for example, a central office 102.

One or more channels may use a power line communication (PLC) system to communicate using a PLC communications technology. Thus, a link may include portions based on multiple communication medias including PLC portions. Likewise, various links may use multiple different PLC communications technologies (e.g., various modulation techniques, bandwidths, data rates, center frequencies, protocols, etc.).

The channels on a link may include a control channel and multiple data channels. In one example, the control channel may be utilized for communicating one or more messages between nodes to specify one of the data channels utilized to transfer data. Transmissions on the control channel may be shorter relative to transmissions on the data channels. Once specified, the nodes 106 may move to the data channel for communication.

Each of the nodes 106 may be implemented as, or associated with, any of a variety of computing devices such as, for example, smart utility meters (e.g., electric, gas, and/or water meters), sensors (e.g., temperature sensors, weather stations, frequency sensors, etc.), control devices, transformers, routers, servers, relays (e.g., cellular relays), switches, valves, power line communication (PLC) transceivers, combinations of the foregoing, or any device couplable to a communication network and capable of sending and/or receiving data.

In this example, the nodes 106 may also be configured to communicate with one or more central processing facilities such as the central office 102 via an edge device (e.g., cellular relay, cellular router, edge router, destination oriented directed acyclic graph (DODAG) root, etc.) which serves as a connection point of the ARA to a backhaul network(s), such as the Internet or one or more public or private intranets. In the illustrated example, node 106-1 and/or 106-5 may serve as edge devices and/or cellular relays to relay communications from the other nodes 106-2 through 106-4 and 106-6 through 106-N of the ARA to and from the central office 102 via the network(s) 104.

As an example, node 106-N may be representative of each of the nodes 106 and includes a radio (e.g., a transceiver) 108, a PLC transceiver 110, a processing unit 112, and a memory 116.

The radio 108 may include a radio frequency (RF) transceiver that may be configured to receive RF signals associated with multiple different RF communication technologies (e.g., frequency shift keying (FSK), offset quadrature phase shift keying (OQPSK), orthogonal frequency-division multiplexing (OFDM), code-division multiple access (CDMA), etc.) at a variety of data rates, and transmit RF signals via one or more of a plurality of RF communication technologies. The radio 108 may include a multiple protocol receiver and may be configured to listen for a plurality of different RF communication technologies in a parallel fashion across multiple links. The radio 108 may also be configured to determine, or facilitate determination of, a received signal strength, such as a "received signal indicator" (RSI) for one or more of the plurality of different RF communication technologies.

In some implementations, each of the nodes 106 includes a single radio 108 configured to send and receive data on multiple different channels, such as the control channel and multiple data channels of each communication link. The radio 108 may also be configured to implement a plurality of different data rates, protocols, signal strengths, and/or power levels. The network architecture 100 may represent a heterogeneous network of nodes 106, in that the nodes 106 may include different types of nodes (e.g., smart meters, cellular relays, sensors, etc.), different generations or models of nodes, and/or nodes that otherwise are capable of transmitting on different channels and using different communication technologies, data rates, protocols, signal strengths, and/or power levels.

The power line communication (PLC) transceiver 110 is configured to transmit and/or receive one or more communication signals on electrical power wiring, including local power wiring and long distance high voltage transmission lines. The PLC transceiver 110 may transmit and/or receive different types of power line communications that include one or more PLC communication technologies (e.g., narrowband PLC, broadband PLC, power line digital subscriber line (PDSL), power line telecom (PLT), power line networking (PLN), broadband over power lines (BPL), etc.) having one or more frequency bands, channels, data rates and/or types of modulation that may depend on the propagation characteristics of the power wiring used.

The processing unit 112 is coupled to the radio 108, the PLC transceiver 110, and the memory 116, and may include one or more processor(s) 114 communicatively coupled to the memory 116. The memory 116 may be configured to store one or more software and/or firmware modules 118, which are executable on the processor(s) 114 to implement various functions. While the modules are described herein as being software and/or firmware executable on a processor, in other examples, any or all of the modules may be implemented in whole or in part by hardware (e.g., as an application specific integrated circuit (ASIC), a specialized processing unit, digital signal processor, etc.) to execute the described functions. In the example of FIG. 1, the memory 116 includes any software and/or firmware executable to bring about any function of the node 106 as a utility meter and a device within a network of nodes 106 including send and receive communications, detect utility consumption, and process data, among other functions of a utility meter.

The memory 116 may comprise computer-readable media and may take the form of volatile memory, such as random access memory (RAM) and/or non-volatile memory, such as read only memory (ROM) or flash RAM. Computer-readable media includes volatile and non-volatile, removable and non-removable media implemented in any method or technology for storage of information such as computer-readable instructions, data structures, program modules, or other data for execution by one or more processors of a computing device. Examples of computer-readable media include, but are not limited to, phase change memory (PRAM), static random-access memory (SRAM), dynamic random-access memory (DRAM), other types of random access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transmission medium that can be used to store information for access by a computing device. As defined herein, computer-readable media does not include communication media, such as modulated data signals and carrier waves.

The network(s) 104 may represent a backhaul network, which may itself comprise a wireless or a wired network, or a combination thereof. The network(s) 104 may be a collection of individual networks interconnected with each other and functioning as a single large network (e.g., the Internet and/or one or more intranets). Further, the individual networks may be wireless or wired networks, or a combination thereof.

The central office 102 may be implemented by one or more computing devices, such as servers, personal computers, and laptop computers, among others. The one or more computing devices may be equipped with one or more processor(s) communicatively coupled to memory. In some examples, the central office 102 includes a centralized meter data management system which performs processing, analysis, storage, and/or management of data received from one or more of the nodes 106. For example, the central office 102 may process, analyze, store, and/or manage data obtained from a smart utility meter, sensor, control device, router, regulator, server, relay, switch, valve, and/or other devices included as the nodes 106. Although the example of FIG. 1 illustrates the central office 102 in a single location, in some examples the central office may be distributed amongst multiple locations and/or may be eliminated entirely (e.g., in the case of a highly decentralized distributed computing platform).

Electrical power may be measured by the node 106-N (and other nodes 106) as the power is used or consumed by a consumer. In one example, a transformer (not shown) delivers power to a consumer by an electrical conductor 130. In one example, the quantity of power that is delivered is measured by a metrology unit 120 associated with node 106-N. The metrology unit 120 associated with node 106-N is able to detect, measure, interrupt, and protect the node 106-N from the power delivered over the conductor 130. The electrical power measured by the metrology unit 120 may be transmitted to the central office 102, and the central office 102 may be configured to include collection engine (CE) functionality. In one example, aspects of the CE functionality may be distributed, partly or fully, within some or all of the nodes 106. The central office 102 and its functionality may be centralized within a utility company, distributed among locations within the network 104, and/or located in a data center location or "cloud" environment.

The node 106-N further includes a load-side voltage detection (LVD) module 122. The LVD module 122 serves to detect whether a load-side voltage (e.g., a back-feed voltage) exists on the load-side of the metrology unit 120 of the node 106-N. Further, the LVD module 122 serves to determine if and when a load-side voltage (LV) disconnect switch 128 may be closed to allow electrical power from the utility provider to be provided to the consumer's building to which the node 106-N (e.g., the electrical power meter) is coupled.

The LVD module 122 of the node 106-N includes an LVD circuit 124. The LVD circuit 124 is described herein in connection with the examples of FIGS. 2 and 3. As indicated in FIG. 1, the LVD circuit 124 may include a first version 126-1 or a second version 126-2. In electrical power meter technologies, form 2 meter and form 12 meter are available for residence and commercial property applications. A form 2S meter is a relatively more common meter form and is most commonly used in a120 V/240 V, single phase three wire service. The form 2S meter is commonly found in residential applications as well as many small business or commercial applications. A form 12 meter is a self-contained meter that may be used on a few different services including, for example, a 3 wire delta three phase service and a single phase service that is pulled off of a three phase transformer. For example, if a 120 V/208 V four wire wye transformer feeds the building and the consumer desires only a single phase, two legs and the neutral may be pulled off the transformer to obtain the single phase.

With reference to the various forms of meters described herein, the "form" designation is in practice a two-part identifier. The number indicates how the meter is wired electrically, and the letter suffix denotes the mechanical form factor of the meter. Thus, the systems and methods described herein may be used in an "S" base meter (e.g. form 2S, form 12S, etc.), an "A"-base meter (e.g. form 2A, form 12A, etc.), or other meter forms. A form 2S meter, for example, is electrically identical to a form 2A meter but includes a different mechanical form factor. To refer to a specific electrical form, irrespective of the mechanical form factor of the meter, only the form number is utilized herein.

Figure 2:
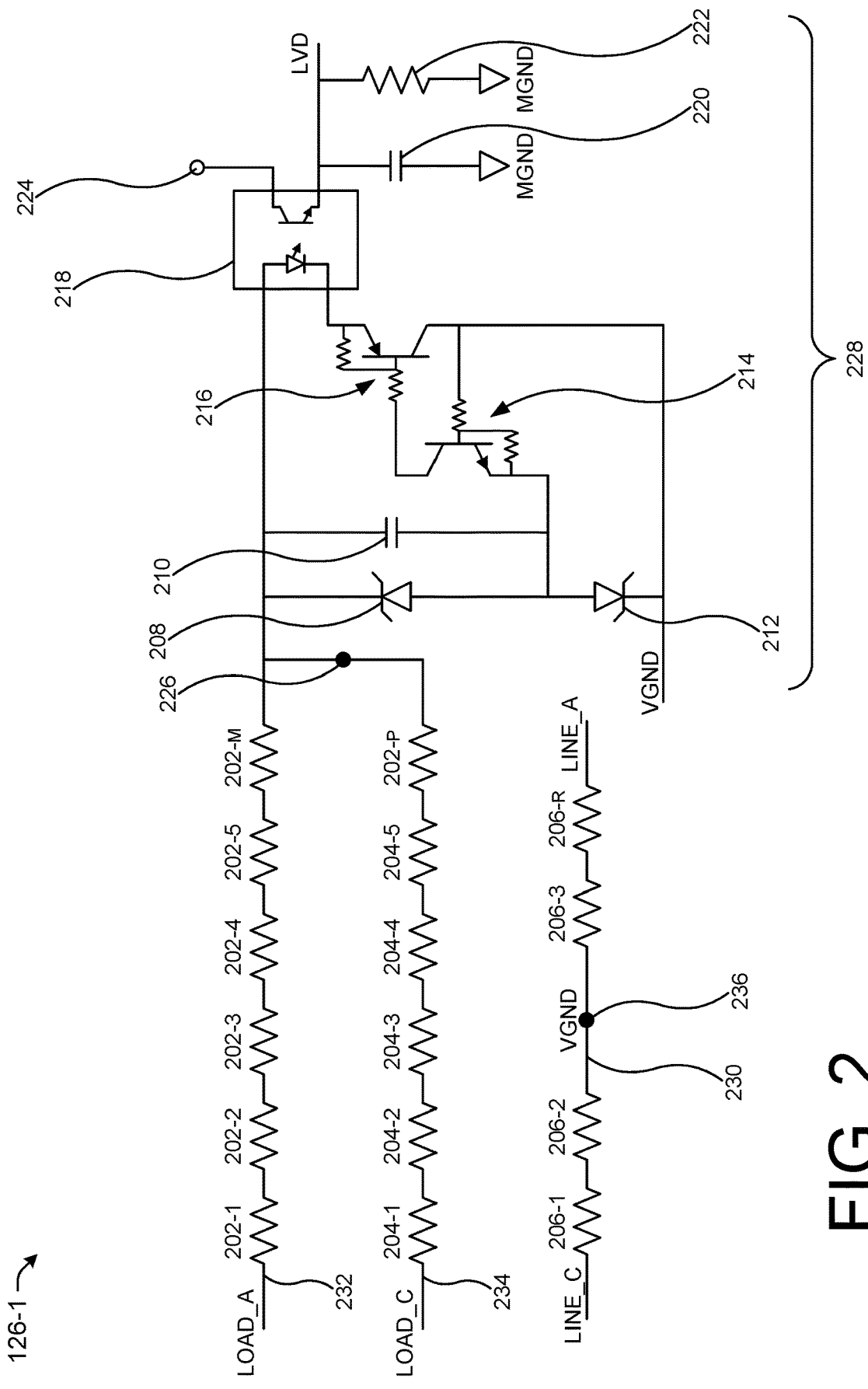
FIG. 2 illustrates a load-side voltage detection circuit for a form 2 utility meter, according to an example of the principles described herein.

In the example of FIG. 2, the first version 126-1 of the LVD circuit 124 is applicable to a form 2 meter. In contrast, in the example of FIG. 3, the second version 126-2 of the LVD circuit 124 is applicable to a form 12 meter. The first version 126-1 and the second version 126-2 will be described in more detail herein in connection with FIGS. 2 and 3, respectively.

The node 106-N further includes the load-side voltage (LV) disconnect switch 128 mentioned above. In one example, the LV disconnect switch 128 may be included as a part of the LVD module 122. In one example, the LV disconnect switch 128 may be a separate module or circuit with respect to the LVD module 122. An LV disconnect switch 128 is a switch used to disconnect and/or connect/reconnect electrical services to the building to which the node 106-N is coupled. As described herein, the existence of the LV disconnect switch 128 within the node 106-N is at least partially the reason for additional regulations and/or standards (e.g., NEMA C12.30) to be propagated in order to increase safety when operating the node 106-N. In the examples described herein, the LV disconnect switch 128 may be opened or closed by a technician located at the node 106-N. In this example, the technician may physically inspect and confirm whether a load-side voltage is applied to the node 106-N by inspecting whether an alternative power source is electrically coupled to the node 106-N. An alternative electrical power source may include, for example, a generator connected to the consumer's building, an alternative power source such as a photovoltaic cell array, electrical cable originating from a neighboring building and utilizing the electrical power supplied to the neighboring building, or by some other means of obtaining electrical power apart from the electrical power utility provider. Thus, the technician, through physical inspection, may remedy the load-side voltage provided by the alternative power source by disconnecting the alternative power source from the load side of the node 106-N.

In one example, however, the LV disconnect switch 128 may be opened or closed by a technician sending a signal to the node 106-N from the central office 102, for example, to the node 106-N. In this example, the technician may not be physically located next to the node 106-N and cannot physically inspect and confirm whether a load-side voltage is applied to the node 106-N. Thus, the LVD circuit(s) 124 may be used to detect if a load-side voltage is present at the node 106-N.

In the examples described herein, the LV disconnect switch 128 may be restricted from closing in instances where the LVD circuit 124 of the LVD module 122 indicates or detects that a load-side voltage is applied to the load-side of the node 106-N. In one example, a notification may be sent to a technician located at the central office 102 or another individual via a computing device. In this example, the notification may be presented on an output device of a computing device and may indicate that a load-side voltage is present at the load-side of the node 106-N. Further, in this example, the technician or other user may be restricted from remotely closing the LV disconnect switch 128 via a signal sent to the node 106-N. The manner in which a signal indicating a load-side voltage is present at the load-side of the node 106-N is produced will be described herein in connection with FIGS. 2 and 3.

Having described the environment in which the node 106 operates, the physical elements of the node 106 (e.g., utility meter) will now be described in connection with FIGS. 2 through 6. Although the nodes 106 have been referred to as "nodes" within this description, the nodes 106 may also be referred to as a utility metering unit, a utility meter, or a metrology device, and will be referred to as a utility meter in connection with FIGS. 2 through 6 to invoke the physical aspects of the utility meter 106.

FIG. 2 illustrates a load-side voltage detection (LVD) circuit 124 for a form 2 utility meter 106, according to an example of the principles described herein. The LVD circuit 124 of the LVD module 122 of FIG. 1 is the first version 126-1 that provides load-side detection for the form 2 utility meter 106. The first version 126-1 of the circuit includes a pulse generator 228 created by the components to the right of test point 226. On a positive swing of the input voltage (and in instances where the input voltage is above a first threshold), a first capacitor 210 charges up to a maximum level set by a clamp voltage of a first diode 208 in parallel with the first capacitor 210. In contrast, on a negative swing of the input voltage (and in instances where the input voltage is above a second threshold) a first transistor 214 turns on, which causes a second transistor 216 to turn on and discharge the capacitance held by the first capacitor 210 though an optoisolator 218, creating a pulse on the isolated output 224. The presence of the optoisolator 218 in the circuit of FIG. 2 creates an isolation boundary (e.g., isolation voltage) in the output signal. The optoisolator 218 connects input and output sides with a beam of light modulated by input current, and transforms the input signal into light, sends it across a dielectric channel, captures light on the output side, and transforms the light back into electric signal. In one example, the optoisolator 218 may be unidirectional and cannot transmit power. The optoisolator 218 may modulate the flow of energy already present on the output side.

The output of the optoisolator 218 may be fed to an LVD input of a metrology ASIC (not shown) such as a MI6 metrology ASIC and indicates the presence of a voltage on one or both load-side terminals of the utility meter 106. Further, in the example of FIG. 1, the first version 126-1 of the circuit utilizes a virtual ground signal provided by a voltage divider 230 to emulate a neutral (e.g., earth ground) which is not present in a form 2 utility meter. The first version 126-1 of the circuit may, for example, monitor each of the two load-side voltage terminals independently. Further, the first version 126-1 of the circuit may have different threshold voltages depending on whether the two load-side terminal voltages are in-phase or out-of-phase. The function and purpose of the various elements of the first version 126-1 of the circuit will now be described in more detail.

In instances where test point 226 is at a positive voltage during a positive swing of the input voltage, the first diode 208 is reverse biased such that it blocks current and forces the current to flow through the capacitor 210 and to the second diode 212. This results in the capacitor 210 charging. In instances where test point 226 is at a negative voltage during a negative swing of the input voltage, the second diode 212 is reversed biased and the first diode 208 is forward biased. This results in the negative voltage between the capacitor 210 and the first transistor 214 such that the first transistor 214 and the second transistor 216 as mentioned above are turned on. In this manner, the capacitive charge held by the capacitor 210 is dumped into the optoisolator 218. The diode (e.g., a light-emitting diode (LED)) in the optoisolator 218 is forward biased by the voltage and causes an isolated output pulse to be output by the optoisolator 218. In this manner, the capacitor 210 charges on the positive voltage swing, and dumps its charge into the optoisolator 218 on the negative voltage swing.

The first version 126-1 of the circuit includes a first load-side voltage (LV) terminal 232 that carries a first load designated as "LOAD_A," meaning load-side A. Thus, the first LV terminal 232 may carry phase A of the load coupled to the load side of the first version 126-1 of the utility meter 106. A second LV terminal 234 may carry a second load designated as "LOAD_C," meaning load-side C. Thus, the second LV terminal 234 may carry phase C of the load coupled to the load side of the first version 126-1 of the utility meter 106. The first LV terminal 232 includes a plurality of first resistors 202-1, 202-2, 202-3, 202-4, 202-5, . . . , 202-m where M is any integer greater than or equal to 1 (collectively referred to herein as first resistor(s) 202 unless specifically addressed otherwise). In the example of FIG. 2, six (6) first resistors 202 are included in the first LV terminal 232 and are coupled in series. However, any number of first resistors 202 may be included in the first LV terminal 232. Similarly, the second LV terminal 234 includes a plurality of second resistors 204-1, 204-2, 204-3, 204-4, 202-5, . . . , 204-P where P is any integer greater than or equal to 1 (collectively referred to herein as second resistor(s) 204 unless specifically addressed otherwise). In the example of FIG. 2, six (6) second resistors 204 are included in the second LV terminal 234 and are coupled in series. However, any number of second resistors 204 may be included in the second LV terminal 234.

The first version 126-1 of the circuit further includes a virtual ground (designated as "VGND" in FIG. 2). The virtual ground may be created by a voltage divider 230 where the voltage divider is any passive linear circuit that produces an output voltage at test point 236 that is a fraction of the voltage at LINE_A. LINE_A Voltage division is the result of distributing the input voltage among the voltage divider resistors 206-1, 206-2, 206-3, . . . , 206-R of the voltage divider, where R is any integer greater than or equal to 1 (collectively referred to herein as voltage divider resistor(s) 206 unless specifically addressed otherwise). The voltage divider includes the voltage divider resistors 206 connected in series, with the voltage at LINE_A applied across the voltage divider resistors 206 and the output voltage emerging from the connection between them at test point 236. VGND is a voltage that approximates the subtraction of LINE_C from LINE_A, which should approximate 0 volts relative to earth ground (neutral). VGND is coupled to the voltage divider 230 at test point 236. In one example, the voltage divider resistors 206 may have a resistive value of 1.2 megaohms (MΩ).

In order to function as a load-side voltage detector, the sum of the first resistor values 202 of the first LV terminal 232 and the sum of the second resistor values 204 of the second LV terminal 234 have total resistance values that are different. The difference in resistance between the first resistors 202 and the second resistors 204 results in a clear detection of a load-side voltage. If, for example, the sum of the resistance values of the first resistors 202 and the sum of the second resistor values 204 were the same, a virtual ground would be created, and detection of the load-side voltage would be impossible. Thus, with the total resistance values of the first resistors 202 and the total resistance values of the second resistors 204 being different and in instances where the same voltage is applied to both the first LV terminal 232 and the second LV terminal 234 with respect to virtual ground (e.g., located at test point 236), the output detected at test point 226 will be a voltage value other than ground. In one example, the resistance values of each of the first resistors 202 may be 220 kiloohms (kΩ) and the resistance values of each of the second resistors 204 may be 680 kΩ. However, any differentiation in resistive values may serve to allow for a detection of a load-side voltage at either or both of the first LV terminal 232 and the second LV terminal 234, and even in instances where the voltages at the first LV terminal 232 and the second LV terminal 234 are in phase or out of phase.

In this manner, if there is voltage present in either the first LV terminal 232 (coupled to LOAD_A or A phase voltage) or the second LV terminal 234 (coupled to LOAD_C or C phase voltage), or if there is voltage present on both the first LV terminal 232 and the second LV terminal 234 (even if the voltages are the same), the first version 126-1 of the circuit can detect that load-side voltage. Further, any load-side voltage at the first LV terminal 232 and/or the second LV terminal 234 may be detected irrespective of those voltage values, the phases of the voltages, or the presence of a voltage at one LV terminal 232, 234 and not the other. Thus, in any scenario of a load-side voltage being present on the utility meter 106, that load-side voltage can be detected and closure of the LV disconnect switch 128 may be restricted and/or notification to not close the LV disconnect switch 128 may be transmitted to a technician. The ability to detect a load-side voltage in the manner provided by the first version 126-1 of the LVD circuit 124 increases safety in operating the utility meter 106 by reducing the potential for damage to or loss of property and reducing or eliminating the potential for a technician or other individual from being harmed by any resulting electrical shock or electricity-related fires that may result if the LV disconnect switch 128 were allowed to close in the presence of a load-side voltage at the LV terminals 232, 234.

As described above, a voltage may be detected at either or both of the LV terminals 232, 234 and that voltage may be detected by and may be used to drive the pulse generator 228. In one example, the voltage(s) from either or both of the LV terminals 232, 234 may be above a number of thresholds in order to activate the pulse generator 228 and allow the pulse generator 228 to function. These thresholds may define voltages referred to as load-side closing (LSC) threshold voltages below which the utility meter 106 may recognize load side conditions as safe. For descriptive purposes, these threshold(s) may be referred to as a "back feed voltage threshold" or an "LSC threshold." In one example where the voltage sensed at test point 226 is below the threshold, the risk of damage to property or life may be de minimis or non-existent and it may be safe to close the LV disconnect switch 128. In one example, the threshold(s) may be set at, for example, approximately 30 volts (V). In this example, if LOAD_A or LOAD_C is below 30 V with respect to the virtual ground (VGND) created by the voltage divider 230, the LV disconnect switch 128 will be allowed to close. In contrast, if LOAD_A or LOAD_C is above 30 V with respect to the virtual ground (VGND) created by the voltage divider 230, the LV disconnect switch 128 will not be allowed to close. Examples of thresholds that may be set for different scenarios include those thresholds defined in the NEMA C12.30 at tables 1 through 4 (and associated FIG. 1) of that standard.

As a voltage is detected at test point 226 above the threshold(s), the pulse generator 228 begins to operate and produce a pulse that is fed to an LVD input at LVD of FIG. 2 of the metrology ASIC (not shown) to detect the presence of the voltage on one or both LV terminals 232, 234 of the utility meter 106. The input voltage at test point 226 is fed into the pulse generator 228 to drive the pulse generator 228.

The pulse generator 228 of the first version 126-1 of the LVD circuit 124 includes a first diode 208 in series with a second diode 212. The triangles in the symbols of the diodes 208, 212 point to the forward direction (e.g., in the direction of conventional current flow). In one example, the diodes 208, 212 may be Schottky diodes. In one example, the first diode 208 and the second diode 212 have a clamp voltage rating of 15 V.

A first capacitor 210 included in the pulse generator 228 may be coupled in parallel with the first diode 208 and may have a capacitance rating of 0.01 microfarad (µF). During a positive swing of the voltage sensed at test point 226, the capacitor 210 charges up to a maximum voltage defined by the clamp voltage of the first diode 208 (e.g., 15 V). During a negative swing of the voltage sensed at test point 226, the capacitor 210 is then discharged through the first transistor 214, turning on the first transistor 214, and through the second transistor 216, turning on the second transistor 216. In one example, the first transistor 214 and the second transistor 216 may be any type transistor such as, for example, a bipolar junction transistor (BJT), a field-effect transistor (FET), or a metal-oxide semiconductor field-effect transistor (MOSFET), among other types of transistors. In one example, the first transistor 214 and the second transistor 216 may be included as one or more integrated circuits in order to save space on a printed circuit board (PCB), save time in manufacturing the utility meter 106 and/or the LVD module 122, or other purpose. In one example, the first transistor 214 is an NPN-type BJT transistor. Further, in one example, the second transistor 216 is a PNP-type transistor.

Once turned on, the first transistor 214 and the second transistor 216 provide a signal to the optoisolator 218. The optoisolator 218 may be any electronic device that transfers electrical signals between two isolated circuits by using electromagnetic radiation (e.g., light). The optoisolator 218 prevents high voltages from negatively affecting the system receiving the signal such as the metrology ASIC (not shown) (e.g., an MI6 metrology ASIC). In one example, the optoisolator 218, as mentioned above, includes a light-emitting diode (LED) and a phototransistor. In another example, the optoisolator 218 includes an LED-photodiode, an LED-light activated silicon controlled rectifier (LASCR), a lamp-photoresistor pair, or other types of optoisolators. The optoisolator 218 may transfer digital (e.g., on-off) signals or analog signals. The output of the optoisolator 218 is a pulse on the isolated output.

The pulse generator 228 also includes a pull-down resistor 222 to ensure that the LVD output is 0 V unless a pulse output is received from the optoisolator 218. Because the optoisolator 218 does not include a component that can pull the signal down to 0 V, the pull-down resistor 222 can pull down that voltage until a pulse (e.g., with a voltage such as 3.3 V) is present on the output of the optoisolator 218. In one example, the pull-down resistor 222 may be a 100 kΩ resistor.

The capacitor 220 functions as a pulse spreader. The pulse that is output by the optoisolator 218 is a relatively brief pulse with a positive polarity, output high active state, and in order for the metrology ASIC (not shown) (e.g., an MI6 metrology ASIC) to detect the pulses from the optoisolator 218, the capacitor 220 holds a charge created by the output pulse of the optoisolator 218 and spreads the pulse width of the output pulse to a width that the metrology ASIC (not shown) (e.g., an MI6 metrology ASIC) can detect and recognize. Also, the capacitor 220 serves to reduce noise on the output pulse from the optoisolator 218 (e.g., radio frequency (RF) filtering).

In some instances, LOAD_A and LOAD_C may be in-phase or out-of-phase with respect to one another. In an instance where LOAD_A and LOAD_C are in-phase, the voltage sensed at test point 226 is increased and, in turn, reduces the input voltage required to make the pulse generator 228 operate. In contrast, in instances where LOAD_A and LOAD_C are out-of-phase, the two loads would have to be at a higher level in order to produce enough voltage at test point 226 in order to cause the pulse generator 228 to operate. Stated another way, in instances where LOAD_A and LOAD_C are in-phase, their respective voltages add together and in instances where LOAD_A and LOAD_C are out-of-phase, their respective voltages subtract from one another. Thus, because each of the first LV terminal 232 and the second LV terminal 234 may be independently analyzed due to the inclusion of the voltage divider 230 in the first version 126-1 of the LVD circuit 124, the in-phase or out-of-phase state of LOAD_A and LOAD_C is irrelevant.

Figure 3:
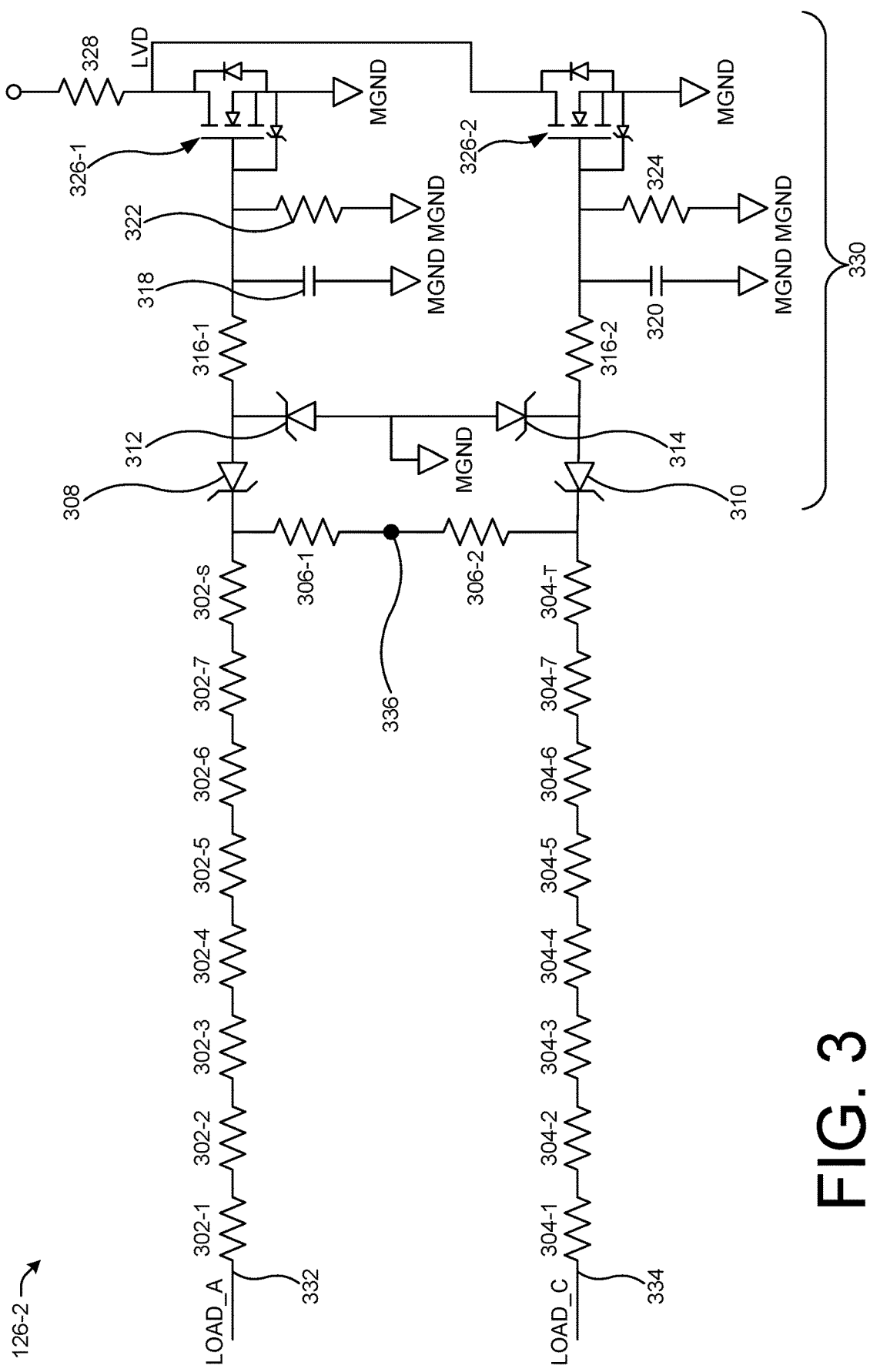
FIG. 3 illustrates a load-side voltage detection circuit for a form 12 utility meter, according to an example of the principles described herein.

FIG. 3 illustrates an LVD circuit for a form 12 utility meter 106, according to an example of the principles described herein. The LVD circuit 124 of the LVD module 122 of FIG. 1 is the second version 126-2 that provides load-side detection for the form 12 utility meter 106. The form 12 utility meter 106 may include two voltages with respect to neutral that may not be perfectly opposing, but may be offset by, for example, 120 degrees (rather than 180 degrees) out-of-phase. For example, for a 120 V input, instead of seeing 240 V between LOAD_A and LOAD_C, approximately 208 V would be sensed. In the form 12 utility meter 106, a connection to neutral is required in order to make an accurate measurement of electrical energy consumption as performed by the utility meter 106. The form 12 utility meter 106 provides for an easier way to balance loads on the incoming utility service.

The second version 126-2 of the circuit includes a pulse generator 330 created by the components to the right of test point 336. Further, the second version 126-2 of the circuit includes a first LV terminal 332 and a second LV terminal 334 as will be described in more detail below. However, unlike the first version 126-1 of the LVD module 122 of FIG. 2, the second version 126-2 of the LVD module 122 of FIG. 3 does not include a voltage divider 230, but is, instead, grounded via a number of mains ground connections designated as MGND and having neutral potential.

The second version 126-2 of the circuit may be thought of as two separate voltage detection circuits which operate independently when not considering resistors 306-1 and 306-2. Resistors 306-1 and 306-2 are included so that two phases either work together or against one another depending on whether the two voltages at the first LV terminal 332 and the second LV terminal 334 are in-phase or out-of-phase. Further, in a similar manner as described above in connection with the form 2 utility meter 106 and its first version 126-1 of the circuit, the form 12 utility meter 106 and its second version 126-2 of the circuit, the detection thresholds are changed based on the phase between the first LV terminal 332 and the second LV terminal 334.

The second version 126-2 of the circuit includes a first load-side voltage (LV) terminal 332 that carries a first load designated as "LOAD_A," meaning load-side A. Thus, the first LV terminal 332 may carry phase A of the load coupled to the load side of the second version 126-2 of the utility meter 106. A second LV terminal 334 may carry a second load designated as "LOAD_C," meaning load-side C. Thus, the second LV terminal 334 may carry phase C of the load coupled to the load side of the second version 126-2 of the utility meter 106. The first LV terminal 332 includes a plurality of first resistors 302-1, 302-2, 302-3, 302-4, 302-5, . . . , 302-s where s is any integer greater than or equal to 1 (collectively referred to herein as first resistor(s) 302 unless specifically addressed otherwise). In the example of FIG. 3, eight (8) first resistors 302 are included in the first LV terminal 332 and are coupled in series. However, any number of first resistors 302 may be included in the first LV terminal 332. Similarly, the second LV terminal 334 includes a plurality of second resistors 304-1, 304-2, 304-3, 304-4, 304-5, . . . , 304-T where T is any integer greater than or equal to 1 (collectively referred to herein as second resistor(s) 304 unless specifically addressed otherwise). In the example of FIG. 3, eight (8) second resistors 304 are included in the second LV terminal 334 and are coupled in series. However, any number of second resistors 304 may be included in the second LV terminal 334.

In order to function as a load-side voltage detector, the first resistors 302 of the first LV terminal 332 and the second resistors 304 of the second LV terminal 334 do not require that their respective resistance values be different unlike the example of FIG. 2. Because each LV terminal 332, 334 is electrically coupled to ground (e.g., MGND), their respective voltages may be independently measured which results in a clear detection of a load-side voltage at either LV terminals 332, 334. In one example, the resistance values of each of the first resistors 302 and the second resistors 304 may be 470 kiloohms (kΩ). However, any resistive values may serve to allow for a detection of a load-side voltage at either or both of the first LV terminal 332 and the second LV terminal 334, and even in instances where the voltages at the first LV terminal 332 and the second LV terminal 334 are in phase or out of phase.

In this manner, if there is voltage present in either the first LV terminal 332 (coupled to LOAD_A or A phase voltage) or the second LV terminal 334 (coupled to LOAD_C or C phase voltage), or if there is voltage present on both the first LV terminal 332 and the second LV terminal 334 (even if the voltages are the same), the second version 126-2 of the circuit can detect that load-side voltage. Further, any load-side voltage at the first LV terminal 332 and/or the second LV terminal 334 may be detected irrespective of those voltage values, the phases of the voltages, or the presence of a voltage at one LV terminal 332, 334 and not the other. Thus, in any scenario of a load-side voltage being present on the utility meter 106, that load-said voltage can be detected, and closure of the LV disconnect switch 128 may be restricted and/or notification to not close the LV disconnect switch 128 may be transmitted to a technician. The ability to detect a load-side voltage in the manner provided by the second version 126-2 of the LVD circuit 124 increases safety in operating the utility meter 106 by reducing the potential for damage to or loss of property and reducing or eliminating the potential for a technician or other individual from being harmed by any resulting electrical shock or electricity-related fires that may result if the LV disconnect switch 128 were allowed to close in the presence of a load-side voltage at the LV terminals 332, 334.

As described above, a voltage may be detected at either or both of the LV terminals 332, 334 and that voltage may be detected by and may be used to drive the pulse generator 330. In one example, the voltage(s) from either or both of the LV terminals 332, 334 may be above a number of thresholds in order to activate the pulse generator 330 and allow the pulse generator 330 to function. These thresholds may define voltages referred to as load-side closing (LSC) threshold voltages below which the utility meter 106 may recognize load side conditions as safe. For descriptive purposes, these threshold(s) may be referred to as a "back feed voltage threshold" or an "LSC threshold." In one example where the voltage sensed at test point 336 is below the threshold, the risk of damage to property or life may be de minimis or non-existent and it may be safe to close the LV disconnect switch 128. In one example, the threshold(s) may be set at, for example, approximately 30 volts (V). In this example, if LOAD_A or LOAD_C is below 30 V with respect to ground (e.g., MGND), the LV disconnect switch 128 will be allowed to close. In contrast, if LOAD_A or LOAD_C is above 30 V with respect to ground (e.g., MGND), the LV disconnect switch 128 will not be allowed to close. Examples of thresholds that may be set for different scenarios include those thresholds defined in the NEMA C12.30 at tables 1 through 4 (and associated FIG. 1) of that standard.

As a voltage is detected at test point 336 above the threshold(s), the pulse generator 330 begins to operate and produce a pulse that is fed to an LVD input at LVD of FIG. 2 of the metrology ASIC (not shown) to detect the presence of the voltage on one or both load-side terminals 332, 334 of the utility meter 106. The input voltage at test point 336 is fed into the pulse generator 330 to drive the pulse generator 330.

The pulse generator 330 of the second version 126-2 of the LVD circuit 124 includes a first dividing resistor 306-1 and a second dividing resistor 306-2 that serve to create a reference voltage and/or reduce the magnitude of the input voltage from the first LV terminal 332 and a second LV terminal 334 so the voltage can be measured. The first dividing resistor 306-1 and the second dividing resistor 306-2 may create the reference voltage with respect to ground (e.g., MGND) as depicted in FIG. 3.

A first diode 308 and a second diode 310 may be electrically coupled in series with a respective one of the first dividing resistor 306-1 and the second dividing resistor 306-2. Further, a third diode 312 is electrically coupled to the first diode 308 in series, and a fourth diode 314 is electrically coupled to the second diode 310 in series. Again, the triangles in the symbols of the diodes 308, 310 point to the forward direction (e.g., in the direction of conventional current flow). As indicated above, neutral or ground exists within the circuit and is located between the third diode 312 and the fourth diode 314.

Resistors 316-1 and 316-2 serve to reduce current flow to respective transistors 326-1, 326-2, and/or adjust signal levels flow to the respective transistors 326-1, 326-2. The respective transistors 326-1, 326-2 may include any type transistor such as, for example, a bipolar junction transistor (BJT), a field-effect transistor (FET), or a metal-oxide semiconductor field-effect transistor (MOSFET), among other types of transistors. In one example, the respective transistors 326-1, 326-2 may be included as one or more integrated circuits in order to save space on a printed circuit board (PCB), save time in manufacturing the utility meter 106 and/or the LVD module 122, or other purpose. In one example, the respective transistors 326-1, 326-2 may include MOSFETS. A first capacitor 318 and the second capacitor 320 are located between the respective resistors 316-1 and 316-2 and the respective transistors 326-1, 326-2. The first capacitor 318 and the second capacitor 320 serve as noise filters. In one example, the first capacitor 318 and the second capacitor 320 may have a capacitance of 22 picofarads (pF).

Further, a first pull-down resistor 322 and a second pull-down resistor 324 are also located between the respective resistors 316-1 and 316-2 and the respective transistors 326-1, 326-2. Resistors 316-1, 316-2 322, and 324 serve as voltage dividers to adjust the load side voltage detection thresholds. In one example, the first pull-down resistor 322 and the second pull-down resistor 324 may have a resistance of 200 kΩ.

A first MOSFET 326-1 and a second MOSFET 326-2 are located in series with the resistors 316-1 and 316-2. The output of the first MOSFET 326-1 and a second MOSFET 326-2 may be fed to an LVD input of a metrology ASIC (not shown) such as a MI6 metrology ASIC and indicates the presence of a voltage on one or both load-side terminals of the utility meter 106. Resistor 328 may serve to reduce current flow and/or adjust signal levels flow in a similar manner as resistors 316-1 and 316-2.

In a similar manner as presented above in connection with the first version 126-1 of the LVD module 122 of FIG. 2, in instances where a voltage is sensed at either the first LV terminal 332 (e.g., LOAD_A is present) or the second LV terminal 334 (e.g., LOAD_C is present), the voltage(s) will cause pulses to be detectable on the drain of either or both of the transistors 326-1, 326-2. In instances where LOAD_A and LOADS are in phase, the two loads work together to reduce the threshold required to detect the voltages due to the inclusion of resistors 306-1 and 306-2. In instances where LOAD_A and LOAD_C are out of phase, the two loads work against one another and a relatively higher voltage is required to be detectable on the collectors of either or both of the transistors 326-1, 326-2.

Having described the examples of FIGS. 2 and 3, it is noted that the LVD pulses output by the first version 126-1 of the LVD circuit 124 depicted in FIG. 2 are positive polarity pulses or output high pulses where the output LVD pulse is normally low (e.g., approximately 0 V) and is high (e.g., approximately 3.3 V) when a pulse is output by the optoisolator 218. In contrast, the LVD pulses output by the second version 126-2 of the LVD circuit 124 depicted in FIG. 3 are of opposite polarity compared to the example of FIG. 2. Thus, the LVD pulses output by the second version 126-2 of the LVD circuit 124 depicted in FIG. 3 may be described as negative polarity pulses or output low pulses where the output LVD pulse is normally high (e.g., approximately 3.3 V) and is low (e.g., approximately 0 V) when a pulse is output by the transistors 326-1, 326-2. However, either version 126-1, 126-2 of the LVD circuit 124 depicted in FIGS. 2 and 3 may be altered such that they are low active (e.g., negative polarity) or high active (e.g., positive polarity).

Figure 4:
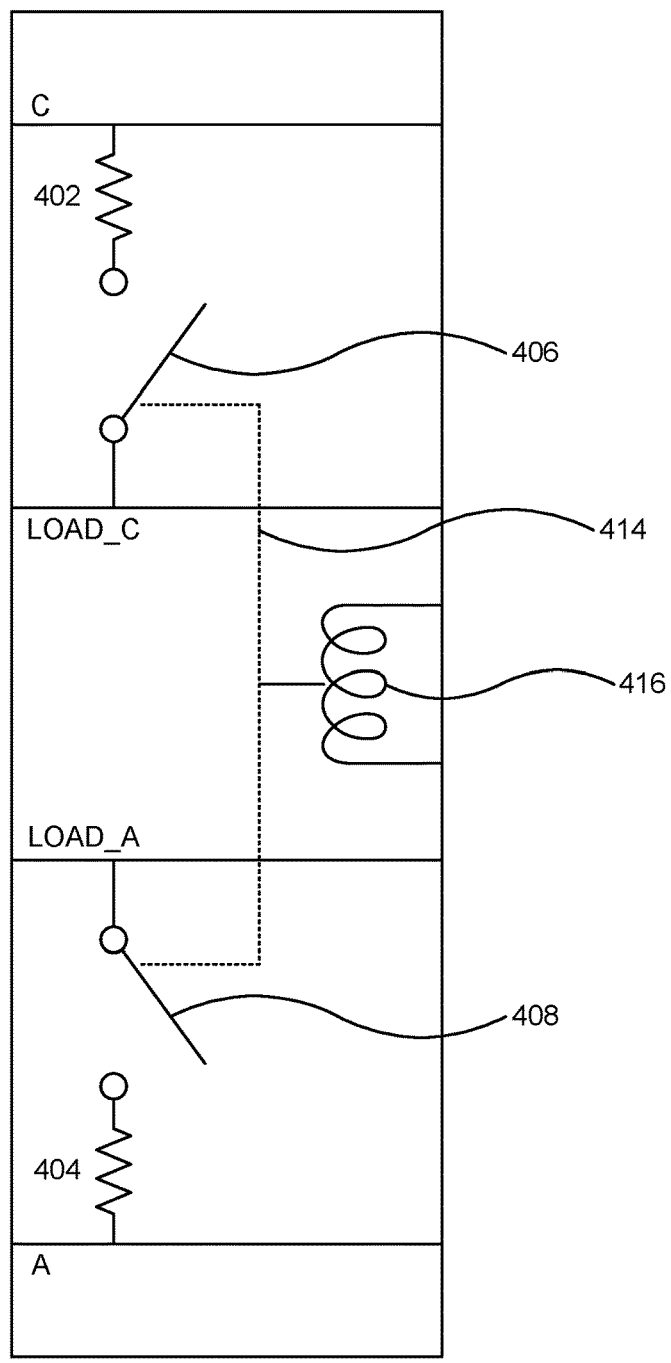
FIG. 4 illustrates a load-side voltage (LV) disconnect switch of a utility meter, according to an example of the principles described herein.

FIG. 4 illustrates a load-side voltage (LV) disconnect switch 128 of a utility meter 106, according to an example of the principles described herein. The LV disconnect switch 128 serves to connect, disconnect, and/or reconnect electrical power services to a residence or commercial building as described herein. In the event that a back-feed voltage is detected by the first version 126-1 or the second version 126-2 of the LVD circuit 124 depicted in FIGS. 2 and 3, respectively, the LV disconnect switch 128 may be precluded from closing and allowing electrical current to flow via the utility meter 106. In other words, LVD circuit 124 of the LVD module 122 serves to determine if and when the LV disconnect switch 128 may be closed to allow electrical power from the utility provider to be provided to the consumer's building to which the node 106-N (e.g., the electrical power meter or utility meter as referred to herein) is coupled.

The LV disconnect switch 128 may include a line side designated as "A", and a corresponding "LOAD_A" located on the load side of the utility meter 106. This LOAD_A line couples to the first LV terminals 232, 332 of FIGS. 2 and 3, respectively. Similarly, the LV disconnect switch 128 may include a line side designated as "C", and a corresponding "LOAD_C" located on the load side of the utility meter 106. This LOAD_C line couples to the second LV terminals 234, 334 of FIGS. 2 and 3, respectively. A first resistor 402 is included between the line side C and a first switch 406 and a second resistor 404 is included between the line side A and a second switch 408. The switches allow electricity to flow to the utility meter 106 and may be controlled by an actuator 416 coupled to the switches 406, 408 via a control line 414. In this manner, a signal may be sent from, for example, the central office 102, to instruct the actuator 416 to disconnect or connect/reconnect the electricity from or to the utility meter 106.

Figure 5:
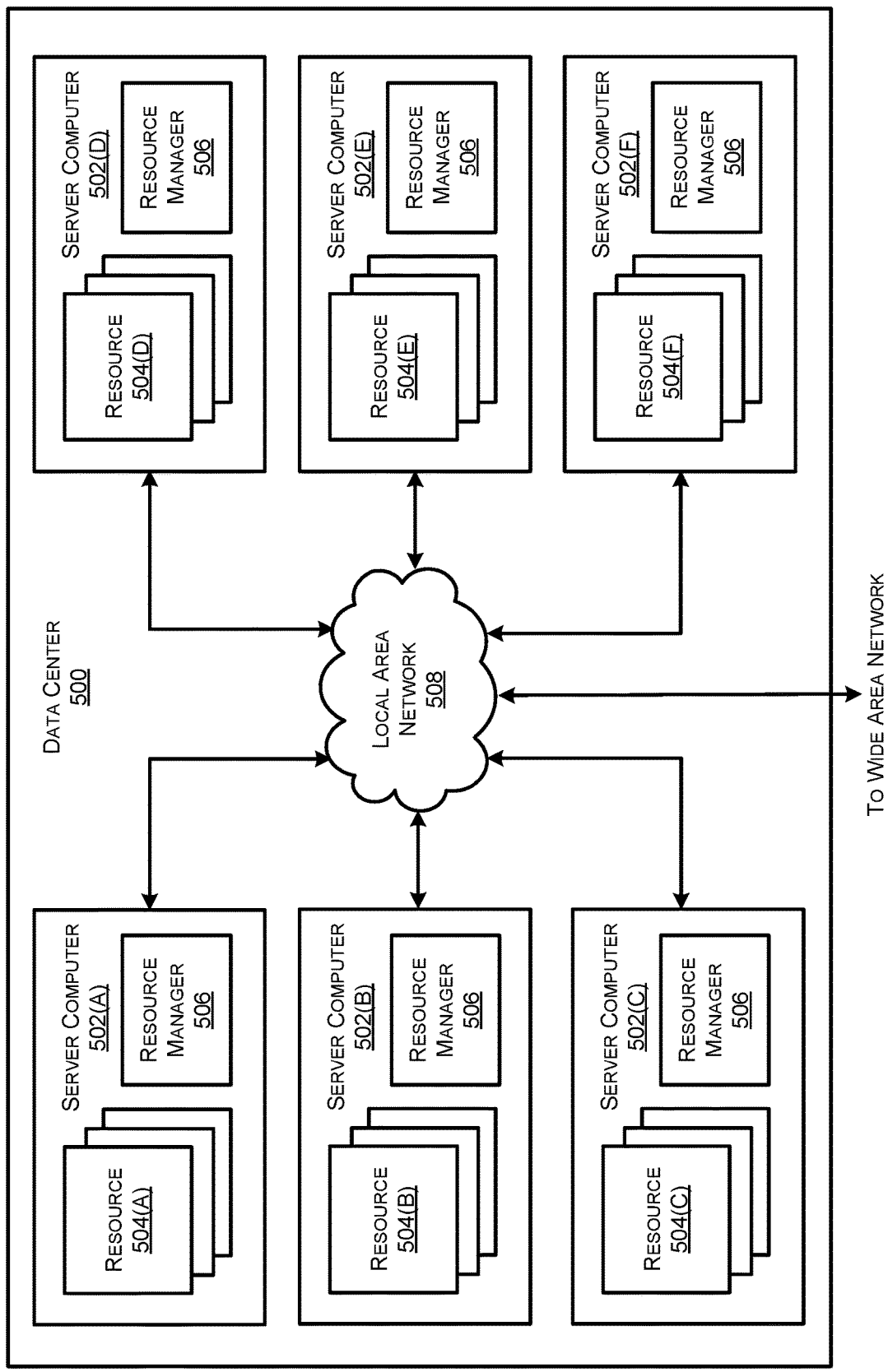
FIG. 5 illustrates a computing system diagram illustrating a configuration for a data center that may be utilized to implement aspects of the technologies disclosed herein.

FIG. 5 illustrates a computing system diagram illustrating a configuration for a data center that may be utilized to implement aspects of the technologies disclosed herein. The example data center 500 shown in FIG. 5 includes several server computers 502A-502F (which might be referred to herein singularly as "a server computer 502" or in the plural as "the server computers 502") for providing computing resources. In some examples, the resources and/or server computers 502 may include, or correspond to, any type of networked device described herein including, for example, the central office 102 and the nodes 106. Although described as servers, the server computers 502 may comprise any type of networked device, such as servers, switches, routers, hubs, bridges, gateways, modems, repeaters, access points, etc.

The server computers 502 may be standard tower, rack-mount, or blade server computers configured appropriately for providing computing resources. In some examples, the server computers 502 may provide computing resources 504 including data processing resources such as VM instances or hardware computing systems, database clusters, computing clusters, storage clusters, data storage resources, database resources, networking resources, virtual private networks (VPNs), and others. Some of the server computers 502 may also be configured to execute a resource manager 506 capable of instantiating and/or managing the computing resources. In the case of VM instances, for example, the resource manager 506 may be a hypervisor or another type of program configured to enable the execution of multiple VM instances on a single server computer 502. Server computers 502 in the data center 500 may also be configured to provide network services and other types of services.

In the example data center 500 shown in FIG. 5, an appropriate LAN 508 is also utilized to interconnect the server computers 502A-502F. It may be appreciated that the configuration and network topology described herein has been greatly simplified and that many more computing systems, software components, networks, and networking devices may be utilized to interconnect the various computing systems disclosed herein and to provide the functionality described above. Appropriate load balancing devices or other types of network infrastructure components may also be utilized for balancing a load between data centers 500, between each of the server computers 502A-502F in each data center 500, and, potentially, between computing resources in each of the server computers 502. It may be appreciated that the configuration of the data center 500 described with reference to FIG. 5 is merely illustrative and that other implementations may be utilized.

In some examples, the server computers 502 and or the computing resources 504 may each execute/host one or more tenant containers and/or virtual machines (VMs) to perform techniques described herein including, for example, instructing a node 106 to disconnect or connect/reconnect electrical power to the node 106 via the LV disconnect switch 128.

In some examples, the data center 500 may provide computing resources, like tenant containers, VM instances, VPN instances, and storage, on a permanent or an as-needed basis. Among other types of functionality, the computing resources provided by a cloud computing network may be utilized to implement the various services and techniques described above. The computing resources 504 provided by the cloud computing network may include various types of computing resources, such as data processing resources like tenant containers and VM instances, data storage resources, networking resources, data communication resources, network services, VPN instances, and the like.

Each type of computing resource 504 provided by the cloud computing network may be general-purpose or may be available in a number of specific configurations. For example, data processing resources may be available as physical computers or VM instances in a number of different configurations. The VM instances may be configured to execute applications, including web servers, application servers, media servers, database servers, some or all of the network services described above, and/or other types of programs. Data storage resources may include file storage devices, block storage devices, and the like. The cloud computing network may also be configured to provide other types of computing resources 504 not mentioned specifically herein.

The computing resources 504 provided by a cloud computing network may be enabled in one example by one or more data centers 500 (which might be referred to herein singularly as "a data center 500" or in the plural as "the data centers 500"). The data centers 500 are facilities utilized to house and operate computer systems and associated components. The data centers 500 typically include redundant and backup power, communications, cooling, and security systems. The data centers 500 may also be located in geographically disparate locations. One illustrative example for a data center 500 that may be utilized to implement the technologies disclosed herein is described herein with regard to, for example, FIGS. 1 through 4.

Figure 6:
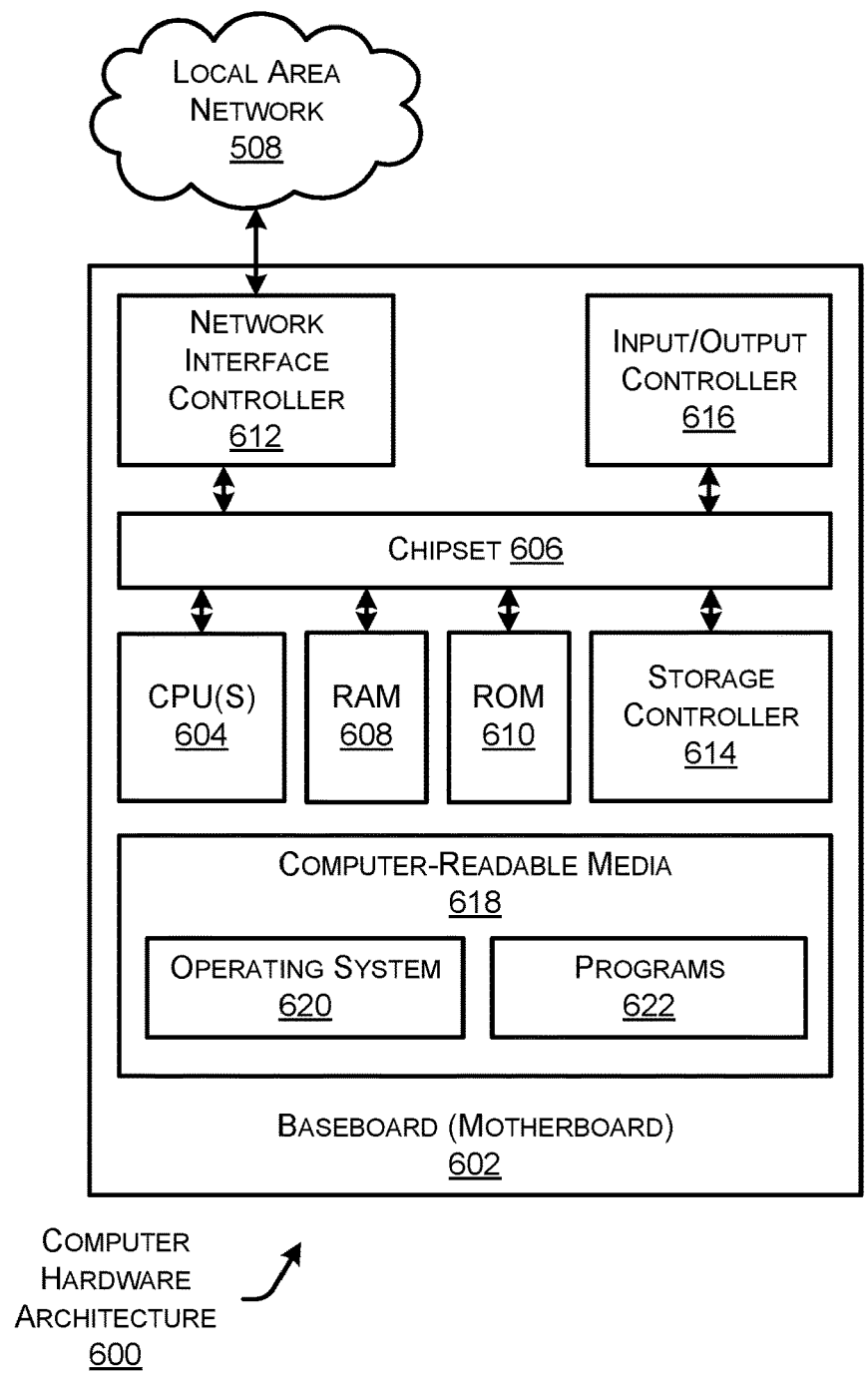
FIG. 6 illustrates a computer architecture diagram showing an example computer hardware architecture for implementing a computing device that may be utilized to implement aspects of the various technologies presented herein.

FIG. 6 illustrates a computer architecture diagram showing an example computer hardware architecture 600 for implementing a computing device that may be utilized to implement aspects of the various technologies presented herein. The computer hardware architecture 600 shown in FIG. 6 illustrates the central office 102, the nodes 106 (e.g., utility meters), and/or other systems or devices associated with the central office 102, the nodes 106 (e.g., utility meters) and/or remote from the central office 102, the nodes 106 (e.g., utility meters), a workstation, a desktop computer, a laptop, a tablet, a network appliance, an e-reader, a smartphone, or other computing device, and may be utilized to execute any of the software components presented herein. The computer 600 may, in some examples, correspond to a network device (e.g., central office 102, the nodes 106 (e.g., utility meters) and associated devices) described herein, and may comprise networked devices such as servers, switches, routers, hubs, bridges, gateways, modems, repeaters, access points, etc.

The computer 600 includes a baseboard 602, or "motherboard," which is a printed circuit board to which a multitude of components or devices may be connected by way of a system bus or other electrical communication paths. In one illustrative configuration, one or more central processing units (CPUs) 604 operate in conjunction with a chipset 606. The CPUs 604 may be standard programmable processors that perform arithmetic and logical operations necessary for the operation of the computer 600.

The CPUs 604 perform operations by transitioning from one discrete, physical state to the next through the manipulation of switching elements that differentiate between and change these states. Switching elements generally include electronic circuits that maintain one of two binary states, such as flip-flops, and electronic circuits that provide an output state based on the logical combination of the states of one or more other switching elements, such as logic gates. These basic switching elements may be combined to create more complex logic circuits, including registers, adders-subtractors, arithmetic logic units, floating-point units, and the like.

The chipset 606 provides an interface between the CPUs 604 and the remainder of the components and devices on the baseboard 602. The chipset 606 may provide an interface to a RAM 608, used as the main memory in the computer 600. The chipset 606 may further provide an interface to a computer-readable storage medium such as a read-only memory (ROM) 610 or non-volatile RAM (NVRAM) for storing basic routines that help to startup the computer 600 and to transfer information between the various components and devices. The ROM 610 or NVRAM may also store other software components necessary for the operation of the computer 600 in accordance with the configurations described herein.

The computer 600 may operate in a networked environment using logical connections to remote computing devices and computer systems through a network, such as the network(s) 104. The chipset 606 may include functionality for providing network connectivity through a Network Interface Controller (NIC) 612, such as a gigabit Ethernet adapter. The NIC 612 is capable of connecting the computer 600 to other computing devices within the central office 102, the nodes 106 (e.g., utility meters) and external to the central office 102, the nodes 106 (e.g., utility meters). It may be appreciated that multiple NICs 612 may be present in the computer 600, connecting the computer to other types of networks and remote computer systems. In some examples, the NIC 612 may be configured to perform at least some of the techniques described herein, such as sending of data or instructions, and/or other techniques described herein.

The computer 600 may be connected to a storage device 618 that provides non-volatile storage for the computer. The storage device 618 may store an operating system 620, programs 622, and data, which have been described in greater detail herein. The storage device 618 may be connected to the computer 600 through a storage controller 614 connected to the chipset 606. The storage device 618 may consist of one or more physical storage units. The storage controller 614 may interface with the physical storage units through a serial attached SCSI (SAS) interface, a serial advanced technology attachment (SATA) interface, a fiber channel (FC) interface, or other type of interface for physically connecting and transferring data between computers and physical storage units.

The computer 600 may store data on the storage device 618 by transforming the physical state of the physical storage units to reflect the information being stored. The specific transformation of physical state may depend on various factors, in different examples of this description. Examples of such factors may include, but are not limited to, the technology used to implement the physical storage units, whether the storage device 618 is characterized as primary or secondary storage, and the like.

For example, the computer 600 may store information to the storage device 618 by issuing instructions through the storage controller 614 to alter the magnetic characteristics of a particular location within a magnetic disk drive unit, the reflective or refractive characteristics of a particular location in an optical storage unit, or the electrical characteristics of a particular capacitor, transistor, or other discrete component in a solid-state storage unit. Other transformations of physical media are possible without departing from the scope and spirit of the present description, with the foregoing examples provided only to facilitate this description. The computer 600 may further read information from the storage device 618 by detecting the physical states or characteristics of one or more particular locations within the physical storage units.

In addition to the storage device 618 described above, the computer 600 may have access to other computer-readable storage media to store and retrieve information, such as program modules, data structures, or other data. It may be appreciated by those skilled in the art that computer-readable storage media is any available media that provides for the non-transitory storage of data and that may be accessed by the computer 600. In some examples, the operations performed by the central office 102, the nodes 106 (e.g., utility meters) and or any components included therein, may be supported by one or more devices similar to computer 600. Stated otherwise, some or all of the operations performed by the central office 102, the nodes 106 (e.g., utility meters), and or any components included therein, may be performed by one or more computer devices operating in a cloud-based arrangement.

By way of example, and not limitation, computer-readable storage media may include volatile and non-volatile, removable and non-removable media implemented in any method or technology. Computer-readable storage media includes, but is not limited to, RAM, ROM, erasable programmable ROM (EPROM), electrically-erasable programmable ROM (EEPROM), flash memory or other solid-state memory technology, compact disc ROM (CD-ROM), digital versatile disk (DVD), high definition DVD (HD-DVD), BLU-RAY, or other optical storage, magnetic cassettes, magnetic tape, magnetic disk storage or other magnetic storage devices, or any other medium that may be used to store the desired information in a non-transitory fashion.

As mentioned briefly above, the storage device 618 may store an operating system 620 utilized to control the operation of the computer 600. According to one example, the operating system 620 comprises the LINUX operating system. According to another example, the operating system comprises the WINDOWS® SERVER operating system from MICROSOFT Corporation of Redmond, Wash. According to further examples, the operating system may comprise the UNIX operating system or one of its variants. It may be appreciated that other operating systems may also be utilized. The storage device 618 may store other system or application programs and data utilized by the computer 600.

In one example, the storage device 618 or other computer-readable storage media is encoded with computer-executable instructions which, when loaded into the computer 600, transform the computer from a general-purpose computing system into a special-purpose computer capable of implementing the examples described herein. These computer-executable instructions transform the computer 600 by specifying how the CPUs 604 transition between states, as described above. According to one example, the computer 600 has access to computer-readable storage media storing computer-executable instructions which, when executed by the computer 600, perform the various processes described above with regard to FIGS. 1-5. The computer 600 may also include computer-readable storage media having instructions stored thereupon for performing any of the other computer-implemented operations described herein.

The computer 600 may also include one or more input/output controllers 616 for receiving and processing input from a number of input devices, such as a keyboard, a mouse, a touchpad, a touch screen, an electronic stylus, or other type of input device. Similarly, an input/output controller 616 may provide output to a display, such as a computer monitor, a flat-panel display, a digital projector, a printer, or other type of output device. It will be appreciated that the computer 600 might not include all of the components shown in FIG. 6, may include other components that are not explicitly shown in FIG. 6, or might utilize an architecture completely different than that shown in FIG. 6.

As described herein, the computer 600 may comprise one or more of the central office 102, the nodes 106 (e.g., utility meters), and/or other systems or devices associated with the central office 102, the nodes 106 (e.g., utility meters) and/or remote from the central office 102, the nodes 106 (e.g., utility meters). The computer 600 may include one or more hardware processor(s) such as the CPUs 604 configured to execute one or more stored instructions. The CPUs 604 may comprise one or more cores. Further, the computer 600 may include one or more network interfaces configured to provide communications between the computer 600 and other devices, such as the communications described herein as being performed by the central office 102, the nodes 106 (e.g., utility meters), and other devices described herein. The network interfaces may include devices configured to couple to personal area networks (PANs), wired and wireless local area networks (LANs), wired and wireless wide area networks (WANs), and so forth. For example, the network interfaces may include devices compatible with Ethernet, Wi-Fi™, and so forth.

The programs 622 may comprise any type of programs or processes to perform the techniques described in this disclosure for a central office 102 and/or the nodes 106 (e.g., utility meters) as described herein. The programs 622 may enable the devices described herein to perform various operations.

In the examples described herein, a load-side voltage detection module for a metrology device may be used to identify instances where the disconnect switch of the metrology device may be closed safely without risk of the damage to the utility metering unit, devices and/or circuits associated with an alternative source of electrical power coupled to the load-side of the utility metering unit, the consumer's building, and other property described herein. Further, the examples described herein provide systems and methods to remotely disconnect and connect/reconnect the utility service (e.g., electrical power) provided via the utility metering unit without the need to dispatch a technician to the utility metering unit while maintaining the safety measures afforded by the load-side detection module.

While the present systems and methods are described with respect to the specific examples, it is to be understood that the scope of the present systems and methods are not limited to these specific examples. Since other modifications and changes varied to fit particular operating requirements and environments will be apparent to those skilled in the art, the present systems and methods are not considered limited to the example chosen for purposes of disclosure, and covers all changes and modifications which do not constitute departures from the true spirit and scope of the present systems and methods.

Although the application describes examples having specific structural features and/or methodological acts, it is to be understood that the claims are not necessarily limited to the specific features or acts described. Rather, the specific features and acts are merely illustrative of some examples that fall within the scope of the claims of the application.

What is claimed is:

1. A load-side voltage detection module for a metrology device comprising:
   a plurality of first resistors electrically coupled to a first load-side terminal, the first resistors being in series;
   a plurality of second resistors electrically coupled to a second load-side terminal, the second resistors being in series and having resistance values different with respect to the first resistors;
   a voltage divider electrically coupled between a first line-side terminal and a second line-side terminal, the voltage divider creating a reference voltage for the load-side voltage detection module; and
   a pulse generator to generate a pulse based on detection of voltage at at least one of the first load-side terminal and the second load-side terminal, the pulse indicating a voltage on at least one of the first load-side terminal or the second load-side terminal, above at least one threshold.

2. The load-side voltage detection module of claim 1, wherein the first load-side terminal and the second load-side terminal are in phase or out of phase with respect to one another.

3. The load-side voltage detection module of claim 1, wherein the pulse generator includes:
   a first transistor electrically coupled to the first resistors; and
   a second transistor electrically coupled to the second resistors, the first transistor and the second transistor generating the pulse on an isolated output.

4. The load-side voltage detection module of claim 1, wherein the pulse generator includes:
   a first diode;
   a second diode in series with the first diode;
   a capacitor in parallel with the first diode;
   a first transistor;
   a second transistor in series with the first transistor, the first transistor and the second transistor being in parallel with the capacitor; and
   an optoisolator electrically coupled to the second transistor, the optoisolator generating the pulse on an isolated output.

5. The load-side voltage detection module of claim 1, wherein the pulse is output to an application specific integrated circuit (ASIC) of the metrology device.

6. The load-side voltage detection module of claim 1, wherein the voltage divider creates a virtual ground.

7. A metrology device comprising:
   a load-side voltage detection module, the load-side voltage detection module including:
     a plurality of first resistors electrically coupled to a first line-side terminal, the first resistors being in series;
     a plurality of second resistors electrically coupled to a second line-side terminal, the second resistors being in series and having resistance values different with respect to the first resistors;
     a voltage divider electrically coupled between a first line-side terminal and a second line-side terminal, the voltage divider creating a reference voltage for the load-side voltage detection module; and
     a pulse generator to generate a pulse based on detection of voltage at at least one of a first load-side terminal and a second load-side terminal, the pulse indicating a voltage on at least one of the first line-side terminal or the second line-side terminal, above at least one threshold.

8. The metrology device of claim 7, further comprising a load-side voltage disconnect switch electrically coupled to the load-side voltage detection module.

9. The metrology device of claim 7, wherein the pulse generator includes:
   a first diode;
   a second diode in series with the first diode;
   a capacitor in parallel with the first diode;
   a first transistor;
   a second transistor in series with the first transistor, the first transistor and the second transistor being in parallel with the capacitor; and
   an optoisolator electrically coupled to the second transistor, the optoisolator generating the pulse on an isolated output.

10. The metrology device of claim 7, wherein the pulse generator includes:
    a first transistor electrically coupled to the first resistors; and
    a second transistor electrically coupled to the second resistors, the first transistor and the second transistor generating the pulse on an isolated output.

11. The metrology device of claim 7, wherein the first line-side terminal and the second line-side terminal are out of phase with respect to one another.

12. The metrology device of claim 7, wherein a sum of values of the first resistors and a sum of values of the second resistors have different total resistance values.

13. The metrology device of claim 7, wherein the pulse is output to an application specific integrated circuit (ASIC) of the metrology device.

14. The metrology device of claim 7, wherein the voltage divider creates a virtual ground.

15. A network, comprising:
    a metrology device communicatively coupled within the network; and
    a central office communicatively coupled to the metrology device at least in part over a power line, wherein the metrology device includes:
a metrology unit, the metrology unit including a load-side voltage detection circuit, the load-side voltage detection circuit including:
a plurality of first resistors electrically coupled to a first load-side terminal, the first resistors being in series;
a plurality of second resistors electrically coupled to a second load-side terminal, the second resistors being in series and having resistance values different with respect to the first resistors;
a voltage divider electrically coupled between a first line-side terminal and a second line-side terminal, the voltage divider creating a reference voltage for the load-side voltage detection circuit; and
a pulse generator to generate a pulse based on detection of voltage at at least one of the first load-side terminal and the second load-side terminal, the pulse indicating a voltage on at least one of the first load-side terminal or the second load-side terminal, above at least one threshold.

16. The network of claim 15, further comprising a load-side voltage disconnect switch electrically coupled to the load-side voltage detection circuit.

17. The network of claim 15, wherein the pulse generator includes:
a first diode;
a second diode in series with the first diode;
a capacitor in parallel with the first diode;
a first transistor;
a second transistor in series with the first transistor, the first transistor and the second transistor being in parallel with the capacitor; and
an optoisolator electrically coupled to the second transistor, the optoisolator generating the pulse on an isolated output.

18. The network of claim 17, wherein the pulse generator includes:
a first metal-oxide-semiconductor field-effect transistor electrically coupled to the first resistors; and
a second transistor electrically coupled to the second resistors, the first transistor and the second transistor generating the pulse on an isolated output.

19. The network of claim 15, wherein the voltage divider creates a virtual ground.

* * * * *